(12) United States Patent
Imai et al.

(10) Patent No.: US 6,285,083 B1
(45) Date of Patent: Sep. 4, 2001

(54) SEMICONDUCTOR DEVICE AND MOUNTING STRUCTURE OF A SEMICONDUCTOR DEVICE

(75) Inventors: Kazunari Imai; Shoji Watanabe, both of Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 09/531,376

(22) Filed: Mar. 21, 2000

(30) Foreign Application Priority Data

Mar. 24, 1999 (JP) .................................................. 11-078732

(51) Int. Cl.[7] .................................................. H01L 23/48
(52) U.S. Cl. ........................... 257/773; 257/772; 257/775
(58) Field of Search .................................... 257/773, 775, 257/772

(56) References Cited

U.S. PATENT DOCUMENTS

| | | | | |
|---|---|---|---|---|
| 4,673,772 | * | 6/1987 | Satoh et al. ............................. | 174/52 |
| 5,616,520 | * | 4/1997 | Nishiuma et al. ..................... | 438/125 |
| 5,761,048 | * | 6/1998 | Trabucco ............................... | 361/760 |
| 5,859,407 | * | 1/1999 | Saiki et al. ............................. | 219/209 |
| 5,907,187 | * | 5/1999 | Koiwa et al. .......................... | 257/737 |
| 6,093,964 | * | 7/2000 | Saitoh ................................... | 257/738 |

* cited by examiner

*Primary Examiner*—Nathan Flynn
*Assistant Examiner*—Remmon R. Fordé
(74) *Attorney, Agent, or Firm*—Pennie & Edmonds LLP

(57) ABSTRACT

A mounting structure is provided for mounting a semiconductor device having an electrode on a mounting substrate having a conductive pad. A metallic bump electrically connects the electrode of the semiconductor device to the conductive pad. A first eutectic solder is used for soldering between the metallic bump and the electrode of the semiconductor device. A second eutectic solder is used for soldering between the metallic bump and the conductive pad of the substrate. A melting point of the metallic bump is higher than those of the eutectic solders and a resistance to fatigue of the first eutectic solder is higher than that of the second eutectic solder. The first eutectic solder is composed of an Sn component of 63% by mass, a Pb component of 34.3% by mass, an In component of 1% by mass, an Sb component of 0.7% by mass, and an Ag component of 1% by mass.

10 Claims, 5 Drawing Sheets

SEMICONDUCTOR DEVICE AND MOUNTING STRUCTURE OF A SEMICONDUCTOR DEVICE

BACKGROUND OF THE INVENTION

1. Field of the Invention

The present invention relates to a structure for mounting a semiconductor device to a mounting substrate, such as a printed circuit board, and a semiconductor device itself.

2. Description of the Related Art

A basic concept of a prior art structure for mounting a semiconductor device to a printed circuit board will be described below with reference to FIG. 4.

First, a general structure of a semiconductor device 10 and a printed circuit board 12 will be explained.

An electrode 14 is formed to be exposed on a surface of the semiconductor device 10.

A metallic bump 16 is attached in advance on a surface of the electrode 14. The metallic bump 16 is made of eutectic solder to have a generally spherical or columnar shape.

A pad 18 is formed on a surface area of the printed circuit board 12 to which the semiconductor device 10 is mounted at a position corresponding to that of the electrode 14 formed on the semiconductor device 10.

Next, the structure for mounting the semiconductor device 10 (onto the printed circuit board 12) will be explained.

The semiconductor device 10 is placed on the mounting area of the printed circuit board 12 so that the respective metallic bumps 16 attached to the respective electrodes 14 of the semiconductor device 10 are located on the corresponding pads 18 of the printed circuit board 12.

While maintaining this positional relationship, heat is applied to melt the metallic bumps 16 of eutectic solder.

Thus, the semiconductor device 10 is mounted onto the printed circuit board 12.

In the above-mentioned prior art structure for mounting the semiconductor device, the spherical or columnar metallic bumps 16 of eutectic solder are molten to flow over the entirety of the pads 12 on the printed circuit board 12 side. Thereby, the metallic bump 16 collapses in shape as shown in FIG. 4 to reduce the height H.

Particularly, when a semiconductor device is small in size, such as indicated at the reference numeral 10 shown in FIG. 5 wherein an insulating protective film 30 is formed on a passivation film 28 through which electrode terminals 26 of aluminum are exposed and circuit patterns 32 electrically connected to the electrode terminals 26 are formed on the protective film 30 and wherein electrodes 14 (of a columnar shape in FIG. 5) are formed on the circuit patterns 32 which are embedded in a mold resin 36 to solely expose tip ends of the respective electrodes 14 to which metallic bumps 16 are attached, or one, as shown in FIG. 6 wherein metallic bumps 16 are directly attached to electrodes 14 formed on an active device surface of a semiconductor chip 24, it is necessary to minimize a diameter of the metallic bump 16 because the arrangement pitch of the electrodes 14 is small. As an example, when a spherical metallic bump 16 of approximately 0.45 mm diameter is formed, a height thereof after being molten will be in a range from approximately 0.3 to 0.32 mm.

However, it has been found that, in a connection-reliability estimation test wherein the semiconductor device 10 is subjected to a heat shock while being mounted to the printed circuit board 12 there is a tendency in that, the higher the height of the metallic bump 16 after being mounted to the printed circuit board 12, the better the test result. Accordingly, it is desirable to maintain the height of the metallic bump 16 as large as possible to realize the high reliability.

Also, when the semiconductor device is subjected to heat shock, fatigue (for example, cracking) may occur in the vicinity of an end of the metallic bump 16 on the semiconductor device 10 side or an end thereof on the printed circuit board 12 side to cause a failure of connection. Accordingly, it is favorable to increase the strength of the end region having a low strength to realize high reliability.

Particularly, since the original height of the metallic bump 16 is low in the semiconductor device 10 shown in FIG. 5 or 6, it is most important to maintain the original height as much as possible to facilitate the connection reliability.

SUMMARY OF THE INVENTION

An object of the present invention is to provide a structure for mounting a semiconductor device to a printed circuit board and a semiconductor device itself capable of further stabilizing the connection between the semiconductor device and the printed circuit board.

Another object of the present invention is to solve the above-mentioned problems in the prior art.

According to the present invention, there is provided a mounting structure for mounting a semiconductor device having an electrode on a mounting substrate having a conductive pad, the structure comprising: a metallic bump electrically connecting the electrode of the semiconductor device to the conductive pad; a first eutectic solder for soldering between the metallic bump and the electrode of the semiconductor device; a second eutectic solder for soldering between the metallic bump and the conductive pad of the substrate;

a melting point of the metallic bump being higher than those of the first and second eutectic solders and a resistance to fatigue of the first eutectic solder is different from that of the second eutectic solder.

According to the present invention as defined above, since the metallic bump is made of metallic material having a melting point higher than those of first and second eutectic solders, the metallic bump is not molten when the semiconductor device is heated during the mounting thereof to maintain the original height. Thereby, a favorable result can be obtained in the connection-reliability estimation test wherein the semiconductor device is subjected to heat shock while being mounted to the printed circuit board. Also, for connecting either one of the end portion of the metallic bump on the semiconductor device side or that on the printed circuit board side, where it is thought fatigue such as cracking is liable to occur when exposed to heat shock, eutectic solder having a higher resistance to fatigue is used, compared to one used for connecting the other end portion, so that a durability to heat shock is facilitated as a whole to result in a high reliability.

An example of the eutectic solder having a higher resistance to fatigue is composed mainly of Sn component and Pb component and also composed of at least two of Ag component, In component, Sb component and Cu component, for example, composed an Sn component of 63% by mass, a Pb component of 14.3% by mass, an In component of 1% by mass, an Sb component of 0.7% by mass and an Ag component of 1% by mass.

The other examples of the eutectic solder having a higher resistance to fatigue are shown in Table I below: (1) two metals (from among Ag, In and Sb) added to Sn and Pb; (2) three metals (Ag, In and Sb) added to Sn and Pb; and (3) four metals (Ag, In, Sb and Cu) added to Sn and Pb.

TABLE I

|  | (% by mass) | | | | | |
| --- | --- | --- | --- | --- | --- | --- |
|  | Sn | Pb | Ag | In | Sb | Cu |
| Two metals added | 63 | bal. | 1.0 | 1.0 | 0 | 0 |
| " | 63 | bal. | 1.0 | 0 | 0.7 | 0 |
| " | 63 | bal. | 0 | 1.0 | 0.7 | 0 |
| " | 63 | bal. | 1.0 | 0 | 1.0 | 0 |
| Three metals added | 63 | bal. | 1.0 | 1.0 | 0.7 | 0 |
| Four metals added | 63 | bal. | 1.0 | 1.0 | 1.0 | 0.1 |

An example of the material for the metallic bump is a high-melting point solder, Cu or Ni, having a melting point higher than that of the eutectic solder.

According to an embodiment of a semiconductor device of the present invention, wherein the insulating protective film is formed on the surface of the semiconductor chip on which the electrode terminals are formed and the circuit patterns electrically connected to the electrode terminals are formed on the insulating protective film and wherein the metallic bumps are attached to the electrodes formed on the circuit patterns, the eutectic solder used between the metallic bump and the electrode is composed of an Sn component of 63% by mass, a Pb component of 34.3% by mass, an In component of 1% by mass and an Ag component of 1% by mass to have a high resistance to fatigue, and the metallic bump is made of a metallic material having a melting point higher than that of the eutectic solder.

According to another embodiment of a semiconductor device of the present invention, wherein the metallic bumps are attached to the electrode terminals formed on the semiconductor device, the eutectic solder used between the metallic bump and the electrode is composed of an Sn component of 63% by mass, a Pb component of 14.3% by mass, an In component of 1% by mass, an Sb component of 0.7% by mass and an Ag component of 1% by mass to have a high resistance to fatigue, and the metallic bump is made of a metallic material having a melting point higher than that of the eutectic solder.

These semiconductor devices have a high durability to heat shock, to result in a high reliability, in the connection-reliability estimation test wherein the semiconductor device is subjected to heat shock after being mounted to the printed circuit board, because eutectic solder used at an end of the metallic bump on the semiconductor device side, which is generally thought to be liable to generate fatigue such as cracking, has a higher resistance to fatigue than that of another eutectic solder used at an end of the metallic bump on the printed circuit board side.

DETAILED DESCRIPTION OF THE EMBODIMENTS

The best modes for carrying out the present invention will be described below, in detail, with reference to the attached drawings.

Figure 1:
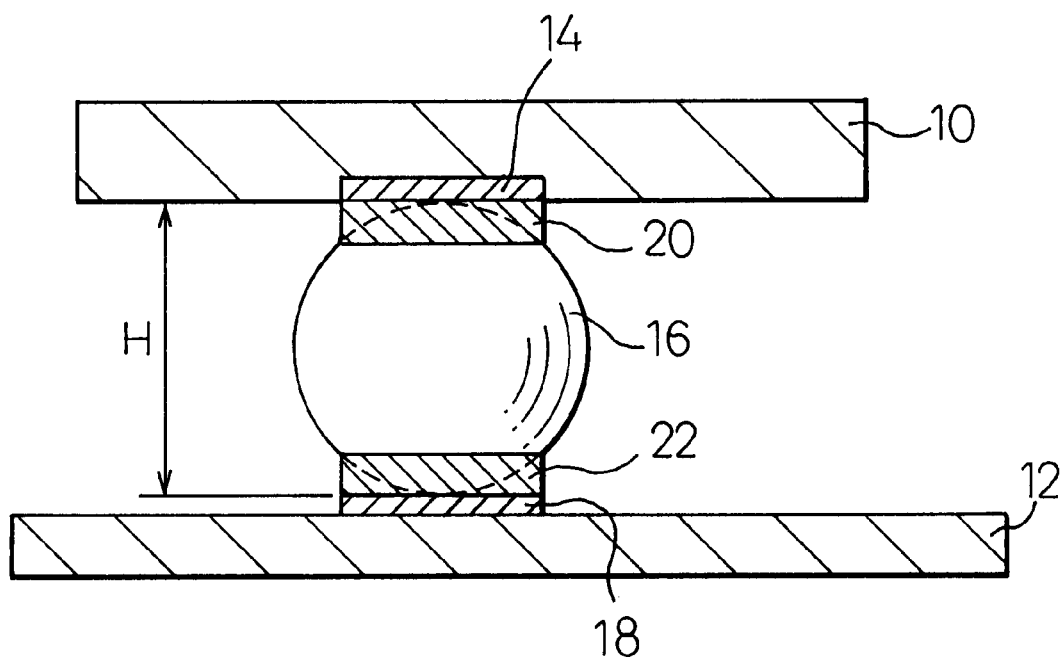
FIG. 1 is an illustration for explaining one aspect of a mounting structure for a semiconductor device according to the present invention.

Initially, a structure for mounting a semiconductor device will be explained by referring to FIG. 1. In this connection, since the basic structure of a semiconductor device and a printed circuit board is substantially the same as that already described with reference to the prior art, the same reference numerals are used in this drawing for denoting similar parts and a detailed explanation thereof will be eliminated.

The electrode 14 of the semiconductor device 10 is electrically connected to the pad 18 on the printed circuit board 12 via the metallic bump 16 formed of metallic material having a higher melting point than that of eutectic solder. Although the metallic bump 16 is formed to have a spherical contour in FIG. 1 as an example, the bump may be of a columnar shape.

A first feature of the mounting structure for the semiconductor device according to the present invention resides in that the metallic bump 16 is made of a metallic material having a higher melting point than that of eutectic solder so that, even if the eutectic solder used for soldering the metallic bump 16 to the electrode 14 of the semiconductor device 10 and to the pad 18 of the printed circuit board 12 as described later is molten, the metallic bump 16 is not molten and maintains the original shape and height H. For example, this metallic material may be a high-melting point solder having a higher melting point than that of the eutectic solder (composed of an Sn component of 61.9% by mass, a Pb component of 38.1% by mass and with a melting point of 183° C.), Cu or Ni. In this regard, the high-melting point solder may be composed of Pb—Sn alloy having Pb component in a range from 90% to 97% by mass. The melting point thereof is approximately 300° C. Since the metallic bump 16 can maintain a predetermined desirable height H thereby, it is possible to achieve a favorable result in the connection-reliability estimation test wherein there is a tendency in that the larger the height of the metallic bump 16 after being mounted to the printed circuit board 12, the better the test result.

While eutectic solder 20, 22 is used for soldering the metallic bump 16 to the electrode 14 of the semiconductor device 10 and to the pad 18 of the printed circuit board 12, a second feature of the present invention resides in that one of the eutectic solder 20 used for connecting the metallic bump 16 to the electrode 14 of the semiconductor device 10 and the eutectic solder 22 used for connecting the metallic bump 16 to the pad 18 of the printed circuit board 12 has a higher resistance to fatigue than that of the other eutectic solder.

One example of the eutectic solder having a higher resistance to fatigue is one composed basically of Pb—Sn alloy added with special elements to crystallize intermetallic compounds in a structure so that migration and growth of Pb is suppressed to realize a longer life or a better resistance to fatigue. A typical composition thereof is an Sn component of 63% by mass, a Pb component of 14.3% by mass, an In component of 1% by mass, an Sb component of 0.7% by mass and an Ag component of 1% by mass to result in a melting point of 183° C.

Portions to be soldered with such a eutectic solder having a high resistance to fatigue are determined by the result of the connection-reliability estimation test wherein the semiconductor device 10 mounted in advance to the printed circuit board 12 is subjected to heat shock.

Generally speaking, since it is necessary to make a surface area of the electrode 14 smaller than that of the pad 18 provided on the printed circuit board 12, a cross-sectional area of a soldered portion between the metallic bump 16 and the electrode 14 of the semiconductor device 10 (i.e., the eutectic solder 20 soldering the end of the metallic bump 16 on the semiconductor device 10 side) is smaller than that of the other soldered portion between the metallic bump 16 and the pad 18 of the printed circuit board 12 (i.e., the eutectic solder 22 soldering the end of the metallic bump 16 on the printed circuit board 12 side). It is thought that fatigue such as cracking is more liable to occur in the eutectic solder 20 soldering the end of the metallic bump 16 on the semiconductor device 10 side in the connection-reliability estimation test. Accordingly, the eutectic solder having a higher resistance to fatigue is used as the eutectic solder 20.

On the contrary, if the surface area of the electrode 14 provided on the semiconductor device 10 is larger than that of the pad 18 provided on the printed circuit board 12 and the eutectic solder used for soldering the end of the metallic bump 16 on the printed circuit board 12 side is more liable to generate fatigue such as cracking in the connection-reliability estimation test, the eutectic solder having a higher resistance to fatigue should be used therefor.

According to such a structure, since the eutectic solder used for connecting one of the ends of the metallic bump 16 on the semiconductor device 10 side and on the printed circuit board 12 side which is thought to be more liable to generate fatigue such as cracking when being subjected to heat shock is improved in durability, it is possible to facilitate the durability of the mounting structure for the semiconductor device 10 as a whole against heat shock, resulting in the achievement of high reliability.

While eutectic solder having a higher resistance to fatigue obtained by adding in advance special elements to a conventional eutectic solder is used in the above embodiment, it is general, when the metallic bump 16 is soldered by using eutectic solder to the electrode 14 of the semiconductor device 10 or the semiconductor device 10 carrying the metallic bump 16 thereon is mounted to the printed circuit board 12, to adopt a method wherein the electrode 14 or the pad 16 is coated with the eutectic solder paste after being coated with flux in advance, or a method wherein a solder layer is plated on the surface of the electrode 14 or the pad 18 and flux is coated thereon.

In such a case, the above-mentioned special elements are not initially added to the eutectic solder but are added to the flux. When the eutectic solder is heated and molten, the special element contained in the flux is mixed with the eutectic solder. As a result, it is possible that the flux mixed in advance with the special elements converts the conventional eutectic solder to that having a high resistance to fatigue.

Next, a construction of a semiconductor device suitable for the above-mentioned mounting structure will be explained with reference to FIGS. 2 and 3.

Figure 5:
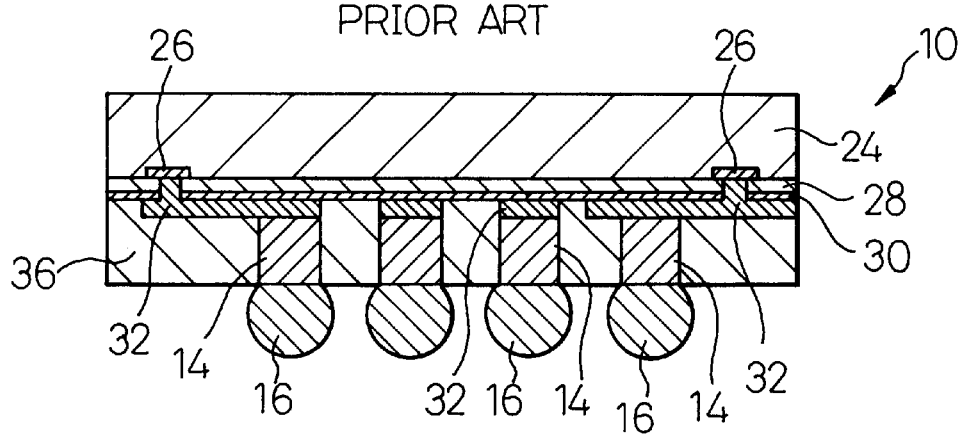
FIG. 5 is an illustration for explaining one example of a prior art semiconductor device.
Figure 6:
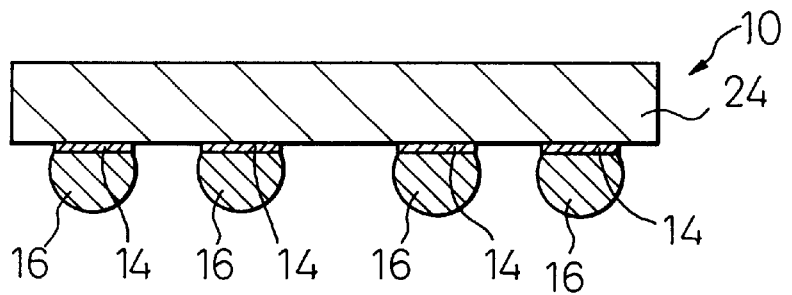
FIG. 6 is an illustration for explaining another example of a prior art semiconductor device.

The semiconductor device described hereinafter is a semiconductor device having a so-called chip size contour already explained with reference to the prior art shown in FIGS. 5 and 6.

Initially, the semiconductor device 10 shown in FIG. 2 will be described. Since this semiconductor device 10 is basically the same as the semiconductor device 10 shown in FIG. 5, the same reference numerals are used for denoting similar parts.

In this structure, an insulating protective film 30 is formed over a passivation film 28 on the electrode terminal-forming surface of a semiconductor chip 24, through which electrode terminals 26 made, for example, of aluminum are exposed. Note there may be a structure having no passivation film 28 and so on.

Circuit patterns 32 electrically connected to the electrode terminals 26 are formed on the protective film 30, and electrodes 14 (of a columnar shape in FIG. 2) are formed on the circuit patterns 32, and embedded in a mold resin 36 so that tip end of the electrodes 14 are solely exposed. Metallic bumps 16 are bonded to the exposed tip ends of the electrodes 14 via eutectic solder 20.

The feature of this arrangement resides in that the metallic bump 16 is formed of metallic material having a melting point higher than that of the eutectic solder, such as a high-melting point solder, Cu or Ni, and the eutectic solder 20 is the above-mentioned one having a high resistance to fatigue.

This is because, as described before, the metallic bump 16 is not molten when the semiconductor device 10 is mounted to the printed circuit board 12 to guarantee a sufficient height H, and the resistance to fatigue of the eutectic solder 20 used for connecting the end of the metallic bump 16 on the semiconductor device 10 side is improved, which portion is empirically thought to be liable to generate fatigue such as cracking in the connection-reliability estimation test.

The other eutectic solder 22 used for connecting the metallic bump 16 to the pad 18 (not shown in FIG. 1, but similar to that shown in FIG. 1) of the printed circuit board 12 when the semiconductor device 10 is mounted to the printed circuit board 12 is of a conventional composition.

Next, the semiconductor device 10 shown in FIG. 3 will be described. The same reference numerals are used for denoting similar parts of the semiconductor device 10 shown in FIG. 2.

An insulating protective film 30 (for example, a polyimide film) is formed over a passivation film 28 through which electrode terminals of a semiconductor chip 26 are exposed, and circuit patterns 32 are formed over the protective film 30 for the connection with the electrode terminals 26.

A second insulating protective film (for example, a polyimide film) 38 is formed all over the surface on which the circuit patterns 32 are provided. Portions of the second protective film 38 corresponding to positions of the circuit patterns 32 to which the metallic bumps 16 are attached are removed to form electrodes 14.

A metallic bump 16 is bonded to the electrode 14 with eutectic solder 20.

Figure 2:
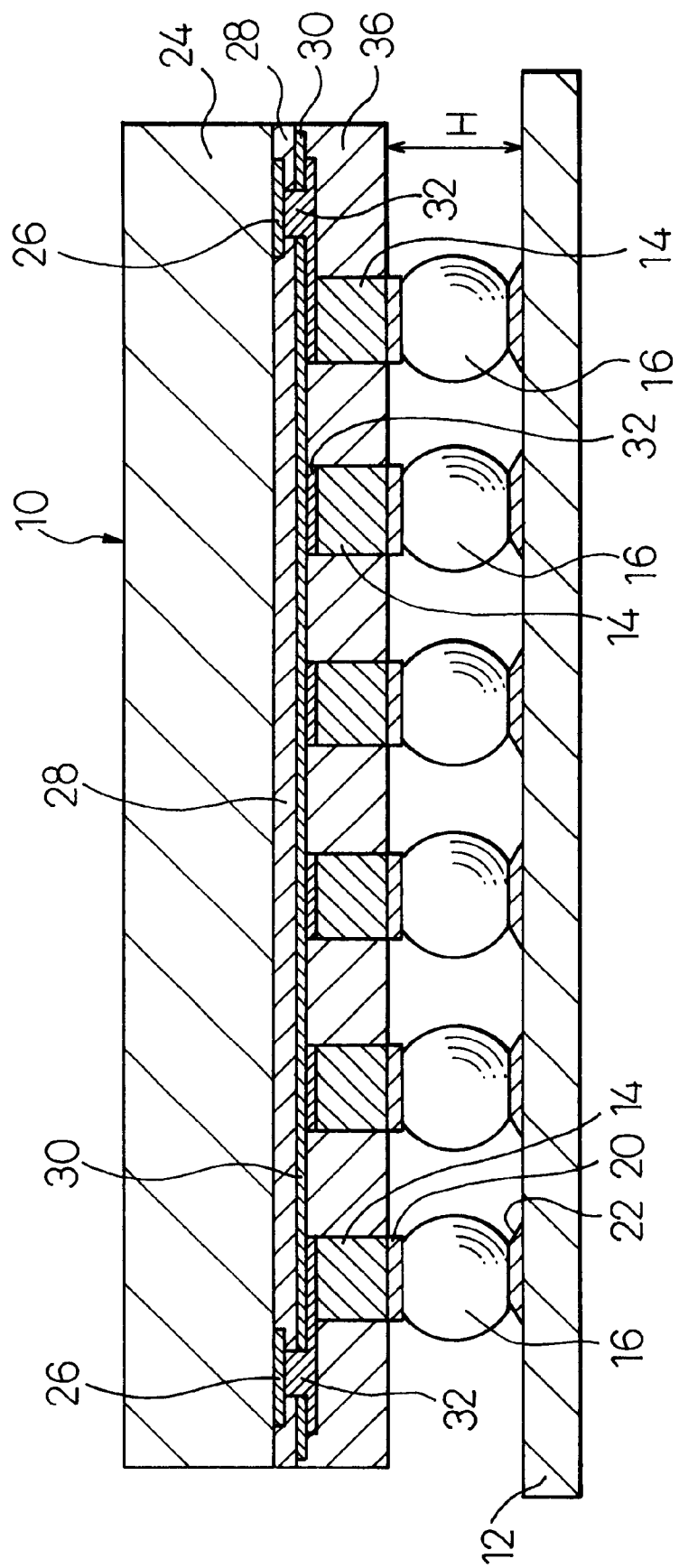
FIG. 2 is an illustration for explaining one aspect of a chip-size semiconductor device according to the present invention as well as for explaining a structure wherein this semiconductor device is mounted to a printed circuit board.
Figure 3:
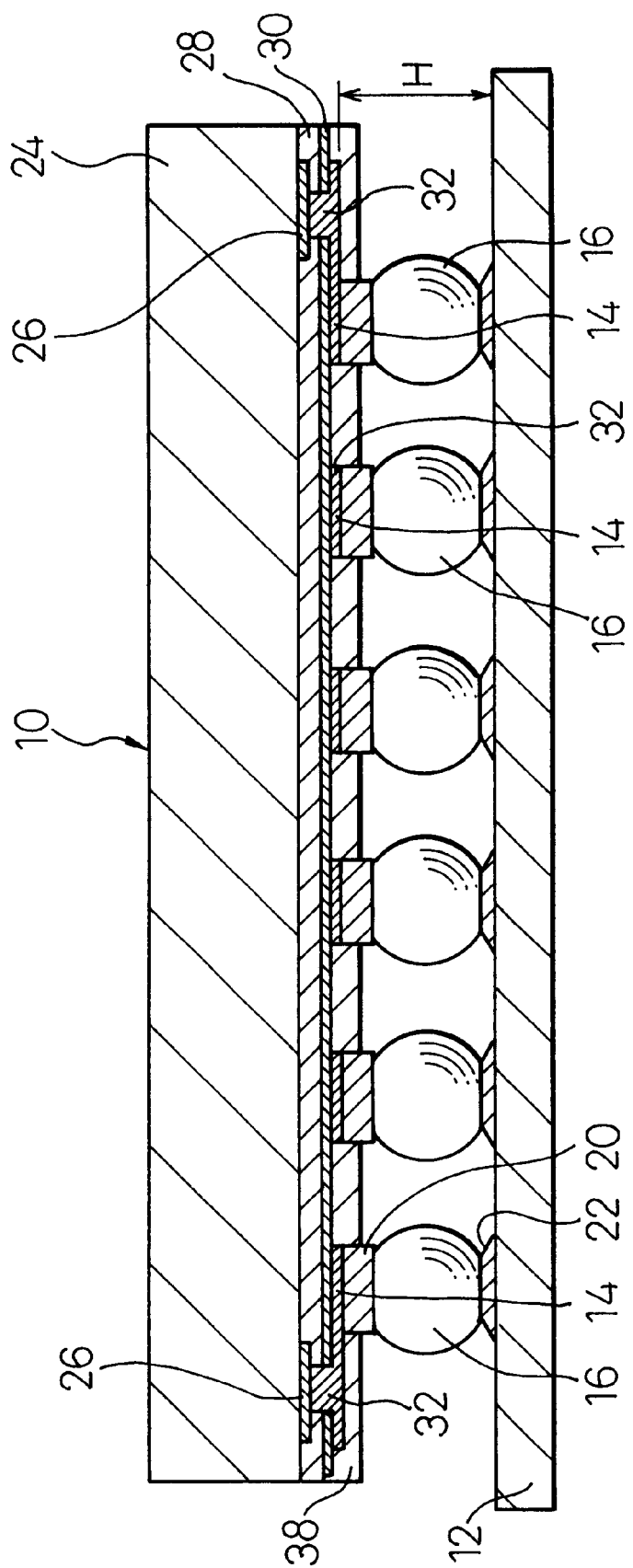
FIG. 3 is an illustration for explaining another aspect of a chip-size semiconductor device according to the present invention as well as for explaining a structure wherein this semiconductor device is mounted to a printed circuit board.
Figure 4:
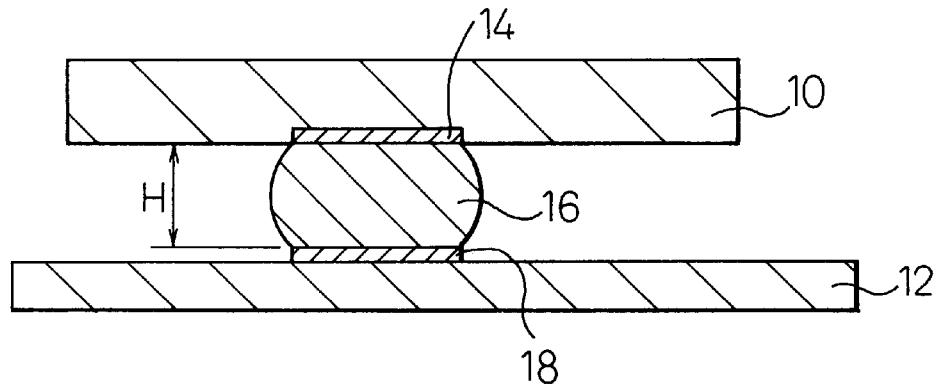
FIG. 4 is an illustration for explaining one example of a prior art mounting structure for a semiconductor device.

In the same manner as in the semiconductor device 10 shown in FIG. 2, the metallic bump 16 is made of metallic material having a melting point higher than that of the eutectic solder, such as high-melting point solder, Cu or Ni, and the eutectic solder 20 is the one having a high resistance to fatigue described above.

When the semiconductor device 10 is mounted to the printed circuit board 12, eutectic solder of a conventional composition is used as the one for connecting the metallic bump 16 to the pad 18 of the printed circuit board 12.

In the semiconductor device 10, already described with reference to FIG. 6 as a prior art, wherein the metallic bump 16 is directly attached to the electrode 14 formed, for example, on the active device surface of the semiconductor chip 24, the metallic bump 16 may be made of metallic material such as high-melting point solder, Cu or Ni having a melting point higher than that of the eutectic solder, and the eutectic solder 20 used for connecting the electrode 14 to the metallic bump 16 may be the one having a high resistance to fatigue described above.

Figure 7:
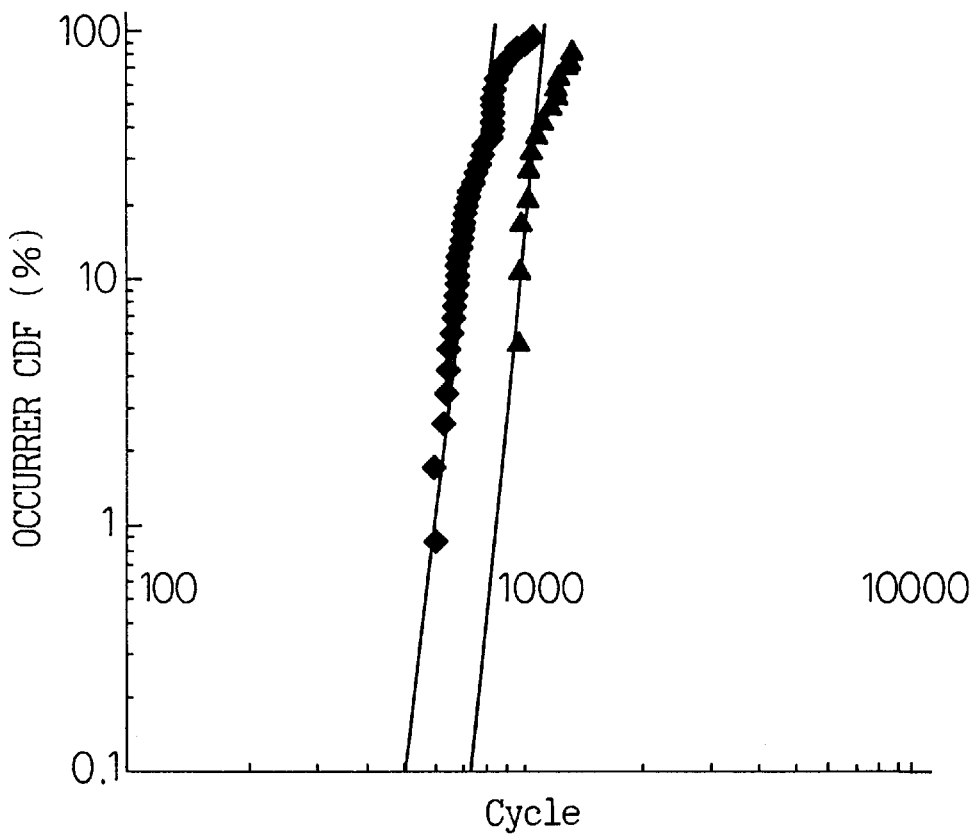
FIG. 7 is a graph showing comparative experimental data on the effect of the present invention with respect to the prior art.
Figure 8:
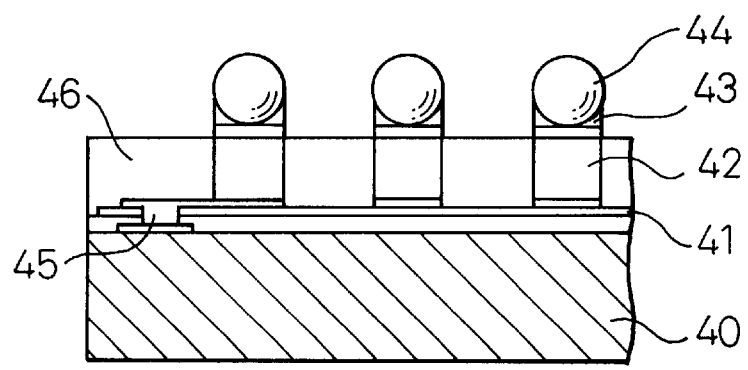
FIG. 8 is a schematic cross-sectional showing a high temperature solder ball used in the experiment of FIG. 7.

In FIG. 7, comparative experimental data of the effect of the present invention and that of the comparative example are shown and FIG. 8 shows a high temperature solder ball used in the experiment of FIG. 7, wherein reference numeral 40 denotes a semiconductor element; 41 polyimide film; 42 metal post (Cu); 43 eutectic solder; 44 high temperature solder ball; 45 wiring pattern; 46 encapsulant.

According to the connection-reliability estimation test wherein the semiconductor device shown in FIG. 8 was subjected to heat shock. The temperature cycle was −40° C. to +125° C. The comparative data of FIG. 7 shows the cycle in which one percent of non-allowable product generates in a semiconductor device of this invention shown in FIG. 8 (FIG. 2 or 3) and a semiconductor device of the prior art as shown in FIG. 5 or 6. As shown in FIG. 7, according to the comparative example wherein a prior art eutectic solder is used, the occurrence CDF is about 600 cycles. Contrary to this, according to the present invention wherein a high temperature solder bump was used, the occurrence CDF is about 900 cycles.

Hear it should be noted that, in the comparative data shown in FIG. 7, the present invention refers to using the solder of "Three metals added" in Table I and the comparative example refers to using the conventional eutectic solder.

Thus, according to the present invention, a semiconductor devices having a high durability to heat shock can thus be obtained.

Since the metallic bump is made of metallic material having a melting point higher than that of eutectic solder according to the structure for mounting the semiconductor device of the present invention, it is possible to prevent the metallic bump from melting when heated during the mounting of the semiconductor device and to maintain the original height thereof. Accordingly, favorable results are obtainable in the connection-reliability estimation test wherein the semiconductor device is subjected to heat shock in a state mounted to the printed circuit board. Since the eutectic solder used for connecting either one of the ends of the metallic bump on the semiconductor device side or on the printed circuit board side, wherein fatigue such as cracking is liable to occur when being subjected to heat shock, has a higher resistance to fatigue than that of the other eutectic solder used for the connection of the other end, it is possible to improve the durability against heat shock as a whole and to achieve the high reliability.

Also, according to the semiconductor device of the present invention, since the metallic bump is made of metallic material having a higher melting point than that of the eutectic solder, it is not molten by the application of heat when the semiconductor device is mounted to keep the original height. Since the eutectic solder used for the connection of the end of the metallic bump on the semiconductor device side where it is empirically thought that fatigue such as cracking is liable to occur when it is subjected to heat shock has a higher resistance to fatigue than that of the other eutectic solder used for the connection of the other end on the printed circuit board side, it is possible to increase the durability against heat shock applied after the semiconductor device has been mounted to result in the high reliability.

It should be understood by those skilled in the art that the foregoing description relates to only some preferred embodiments of the disclosed invention, and that various changes and modifications may be made to the invention without departing from the spirit and scope thereof.

What is claimed is:

1. A mounting structure for mounting a semiconductor device having an electrode on a mounting substrate having a conductive pad, said structure comprising:

a metallic bump electrically connecting said electrode of the semiconductor device to said conductive pad;

a first eutectic solder for soldering between said metallic bump and said electrode of the semiconductor device;

a second eutectic solder for soldering between said metallic bump and said conductive pad of the substrate;

wherein a melting point of said metallic bump is higher than those of said first and second eutectic solders, a resistance to fatigue of said first eutectic solder is higher than that of said second eutectic solder, and said first eutectic solder is composed mainly of a Sn component and a Pb component, and also composed of at least two of an In component, a Sb component, an Ag component, and a Cu component.

2. A mounting structure as set forth in claim 1, wherein said metallic bump is a high-melting point solder, Cu or Ni, having a melting point higher than those of said first and second eutectic solders.

3. A mounting structure for mounting a semiconductor device having an electrode on a mounting substrate having a conductive pad, said structure comprising:

a metallic bump electrically connecting said electrode of the semiconductor device to said conductive pad;

a first eutectic solder for soldering between said metallic bump and said electrode of the semiconductor device;

a second eutectic solder for soldering between said metallic bump and said conductive pad of the substrate;

wherein a melting point of said metallic bump is higher than those of said first and second eutectic solders, a resistance to fatigue of said second eutectic solder is higher than that of said first eutectic solder, said second eutectic colder is composed mainly of a Sn component and a Pb component, and also composed of at least two of an In component, a Sb component, an Ag component, and a Cu component.

4. A mounting structure as set forth in claim 3, wherein said metallic bump is a high-melting point solder, Cu or Ni, having a melting point higher than those of said first and second eutectic solders.

5. A semiconductor device comprising:

a semiconductor element having an electrode forming surface on which a first electrode terminal and an insulating protective film are formed;

a wiring pattern formed on said protective film so as to electrically connect to said first electrode terminal;

a metallic bump electrically connected to said wiring pattern by means of a second electrode terminal;

an eutectic solder for soldering between said metallic bump and said second electrode terminal, said eutectic solder having a high resistance to fatigue and being composed of an Sn component of 63% by mass, a Pb component of 34.3% by mass, an In component of 1% by mass, a Sb component of 0.7% by mass, and an Ag component of 1% by mass; and a melting point of said metallic bump being higher than that of said eutectic solder.

6. A semiconductor device comprising:

a semiconductor element having an electrode;

a metallic bump electrically connected to said electrode;

an eutectic solder for soldering between said metallic bump and said electrode, said eutectic solder has a high resistance to fatigue and composed mainly of a Sn component and a Pb component, and also composed of at least two of an In component, a Sb component, an Ag component, and a Cu component; and a melting point of said metallic bump being higher than that of said eutectic solder.

7. A mounting structure for mounting a semiconductor device having an electrode on a mounting substrate having a conductive pad, said structure comprising:

a metallic bump electrically connecting said electrode of the semiconductor device to said conductive pad;

a first eutectic solder for soldering between said metallic bump and said electrode of the semiconductor device; and a second eutectic solder for soldering between said metallic bump and said conductive pad of the substrate;

wherein said metallic bump is a high-melting point solder, Cu or Ni, a melting point of said metallic bump is higher than those of said first and second eutectic solders, and a resistance to fatigue of said first eutectic solder is higher than that of said second euetectic solder.

8. A mounting structure for mounting a semiconductor device having an electrode on a mounting substrate having a conductive pad, said structure comprising:

a metallic bump electrically connecting said electrode of the semiconductor device to said conductive pad;

a first eutectic solder for soldering between said metallic bump and said electrode of the semiconductor device; and a second eutectic solder for soldering between said metallic bump and said conductive pad of the substrate;

wherein said metallic bump being a high-melting point solder, Cu or Ni, and a melting point of said metallic bump being higher than those of said first and second eutectic solders, and a resistance to fatigue of said second eutectic solder is higher than that of said first eutectic solder.

9. A semiconductor device comprising:

a semiconductor element having an electrode forming surface on which a first electrode terminal and an insulating protective film are formed;

a wiring pattern formed on said protective film so as to electrically connect to said first electrode terminal;

a metallic bump electrically connected to said wiring pattern by means of a second electrode terminal;

an eutectic solder for soldering between said metallic bump and said second electrode terminal, said eutectic solder having a high resistance to fatigue and being mainly composed of a Sn component and a Pb component, and also composed of at least two of an In component, a Sb component, an Ag component, and a Cu component; and a melting point of said metallic bump being higher than that of said eutectic solder.

10. The semiconductor device of claim 9 wherein at least one of the In component, Sb component, Ag component, and Cu component was contained in a flux disposed on the eutectic solder such that the eutectic solder achieved the composition on melting and incorporating the metallic element(s) of the flux.

* * * * *